United States Patent
Napier

[15] 3,691,290
[45] Sept. 12, 1972

[54] DELETABLE CONDUCTOR LINE STRUCTURE

[72] Inventor: John Napier, Poughquag, N.Y.

[73] Assignee: International Business Machines Corporation, Armonk, N.Y.

[22] Filed: Dec. 14, 1970

[21] Appl. No.: 97,857

[52] U.S. Cl. ................174/68.5, 29/625, 174/DIG. 3, 317/101 CC

[51] Int. Cl. ................H05k 1/02

[58] Field of Search .....174/68.5, DIG. 3; 317/101 B, 317/101 CC, 101 C; 29/625, 626; 117/212

[56] References Cited

UNITED STATES PATENTS 3,176,381 4/1965 Elarde ..................174/68.5 X
3,342,927 9/1967 Kubik et al. ..............174/68.5
3,487,541 1/1970 Boswell....................29/625 X

*Primary Examiner*—Darrell L. Clay
*Attorney*—Hanifin & Jancin and David M. Bunnell

[57] ABSTRACT

A deletable conductor line structure permits a variety of circuits to be made from a single master pattern. A thin film of metal, which has marginal adherence to the circuit supporting substrate material, is first deposited in a discontinuous pattern on the surface of the substrate. A master circuit pattern of conductive material is then deposited on the substrate such that portions of the master circuit conductor lines overlie the discontinuous metal pattern. A selected circuit is formed by deleting certain portions of the conductor lines at the point where they overlie portions of the metal film having marginal adherence to the substrate.

7 Claims, 9 Drawing Figures

INVENTOR
JOHN NAPIER

BY David W. Bunnell
ATTORNEY

DELETABLE CONDUCTOR LINE STRUCTURE

BACKGROUND OF THE INVENTION

In forming integrated circuit devices, one or more solid-state chips are connected to the surface of a glass/metal module. The module comprises a ceramic substrate on which are one or more layers of conductor lines or patterns which form the electrical connections to the chips necessary to complete the desired circuits. These conductor patterns are formed, for example, either by depositing a film or conductive metal on the substrate and removing unwanted portions by etching or by placing a mask on the substrate and vapor depositing metal through the openings in the mask. By these methods a single set of masks can be utilized to turn out like devices in large numbers. However, because a variety of different circuits can be formed from a combination of chips, each of which individually contain many different circuits, it is desirable to alter the conductor pattern on the surface of the glass/metal module without the expense of preparing a different set of masks for each circuit pattern. This can be done, for example, by using a single master conductor line pattern and deleting certain portions of the pattern to create electrical opens in certain of the conductor lines. This has been done in the past by abraiding or chipping off a portion of the conductor line where the electrical open is desired. Problems have arisen in attempting to use this method because a clean break is needed but the force necessary to completely remove the metal often damages the thin glass protective layer on the surface of the module. This layer normally protects the module against ion migration and moisture penetration into the substrate. If the protective glass layer is broken during the deletion process then ion migration or moisture penetration into the substrate can cause failure of the entire device.

SUMMARY OF THE INVENTION

A glass/metal module structure and method of its formation have now been found which permits custom making a variety of circuit patterns from a master pattern of conductor lines by permitting a clean break in the conductor line without damage to the surface of the module.

In accordance with this invention a method of making selectively removable conductor metallurgy for an integrated circuit module comprises forming low adhesion metal pads in selected areas under normally highly adherent conductor metallurgy. A force can then be applied to selected portions of the conductor metallurgy which overlie the low adhesion metal pads to remove the selected portions from the surface of the module and create electrical opens.

A readily deletable conductor line structure comprises a normally highly adherent metal conductor layer supported on a substrate with a low adhesion metal pad underlying a portion of the layer.

DESCRIPTION OF THE DRAWINGS

The foregoing and other objects, features and advantages of the invention will be apparent from the following more particular description of the preferred embodiment of the invention as illustrated in the accompanying drawings.

DETAILED DESCRIPTION

Figure 1:
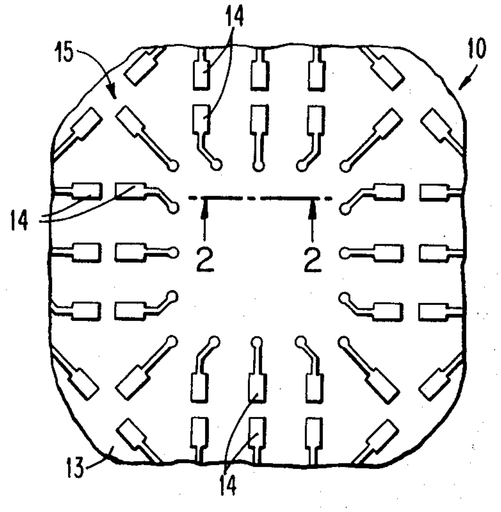
FIG. 1 is a plan view of a portion of a glass/metal module.
Figure 2:
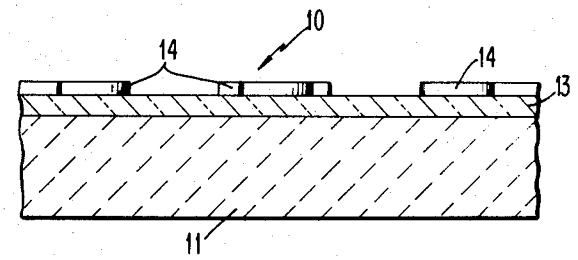
FIG. 2 is an enlarged cross sectional view taken along lines 2—2 of FIG. 1.

Turning now to FIGS. 1 and 2, module 10 is made up of a ceramic substrate 11 having a thin glass surface layer 13 which is a few mils in thickness. In multi-chip devices substrate 11 may have on its surface a number of alternating layers of glass and metal conductor patterns. On the surface of glass layer 13 are conductor lines 14 which make up a series of patterns 15 each of which is structured to connect to a semiconductor chip (not shown). One complete pattern 15 is illustrated in the center of FIG. 1 along with portions of the four surrounding patterns.

Underlying metal conductor patterns which are separated by insulating layers of, for example, glass can be used to provide additional electrical interconnection of the chips with via holes through the insulating layers providing connections between layers. Surface pads or metal pins are conventionally used to furnish connection of the devices to the outside.

The conductor line patterns 15 are conventionally formed either by evaporating or screening conductor material through a mask placed in contact with the surface of the substrate or by depositing a blanket layer followed by sub-etching the layer to form the pattern. The conductor line thickness is usually built up by plating on an additional metal deposit to provide the thickness necessary to maintain the electrical integrity of the lines. Such structures as described to this point are known in the art. Where substrates have a number of chip positions, many integrated circuits are possible by changes in the conductor pattern. The changes have been accomplished either by utilizing a different set of masks for each circuit which is desired, an expensive procedure, or by deleting portions of the conductor lines from a master pattern which heretofore has caused damage to the glass/metal module.

Figure 3:
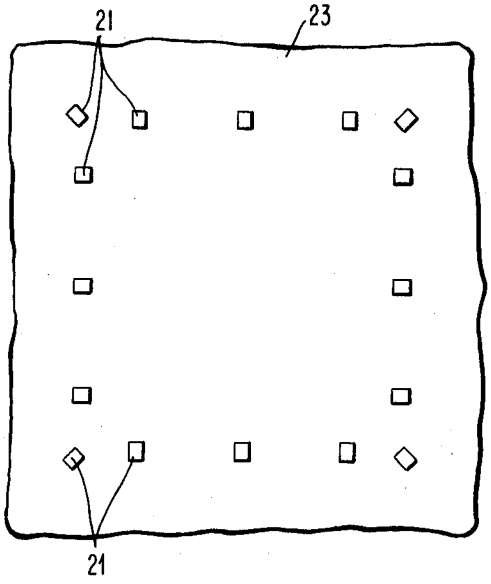
FIG. 3 is a plan view of a module with a pattern of pads of low adherence metal.

The invention improves the deletion technique by first forming a pattern of pads 21 as illustrated in FIG. 3 of a low adhesion metal such as, for example, copper and gold. The pattern is formed in places where it may be desirable to form an electrical open in an overlying conductor line. The pattern can be formed by conventional techniques such as screening or evaporation through a mask or by depositing a blanket film of the material and then selectively etching the film to remove portions and form the required pattern. The pattern of pads 21 was formed by the evaporation of copper through a metal mask placed in contact with the surface of substrate 23 to a thickness of about 1,500 A.

Figure 4:
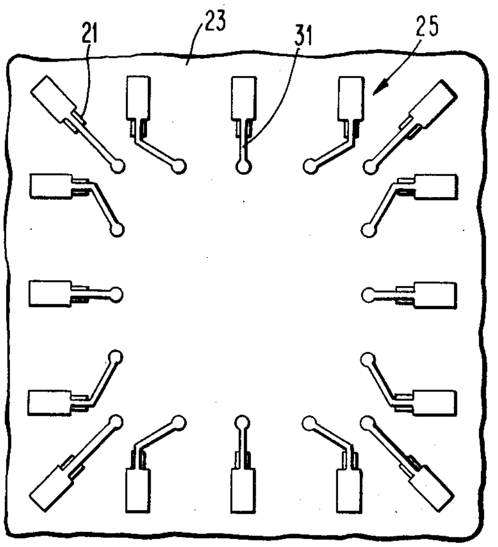
FIG. 4 is a plan view of the module of FIG. 3 having a master circuit pattern formed thereon.
Figure 5:
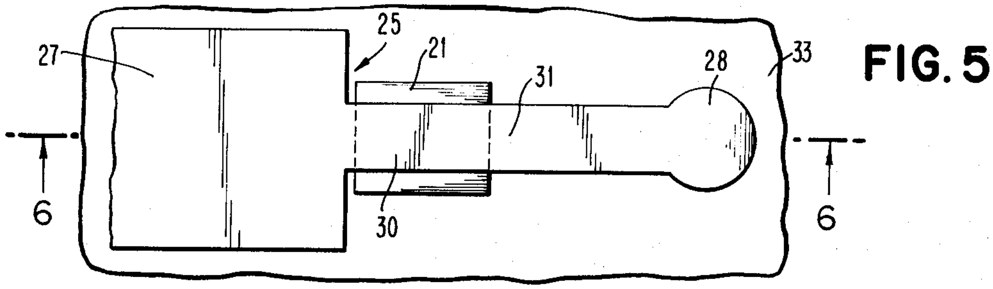
FIG. 5 is an enlarged view of the portion of the conductor line shown in FIG. 4.
Figure 6:
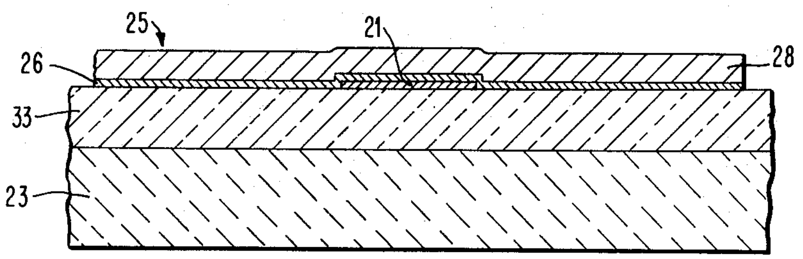
FIG. 6 is a sectional view through lines 6—6 of FIG. 5.

After forming pads 21, a master pattern of highly adherent conductor segments 25 was formed (FIG. 4) by the blanket evaporation of chromium plus the platable metal copper. An additional layer of nickel and gold was then electroplated onto the Cr-Cu layer to build up the thickness necessary to assure that the conductor lines will have and maintain electrical integrity. A cross section of the structure is shown in FIG. 6 with Cr-Cu layer 26 underlying the structure layer 28 of plated metals. The blanket layer was then masked with a photo resist and selectively etched to form the desired wiring pads 27, via caps 29 and conductor lines 31. As shown in FIG. 5 which is an enlarged view of a portion of a conductor segment 25 shown in FIG. 4, the conductor line 31 overlies the pad 21 of low adhesion metal. This is further illustrated in cross section (FIG. 6) wherein glass layer 33 overlies the ceramic substrate 23 and pad 21 on glass layer 33 underlies and is at least coextensive in width with a portion 30 of conductor line 25. Pad 21 as shown is actually formed to be slightly wider than line 25 to account for any misalignment of pads and lines and assure that the low adherent pad 21 will completely underlie the width of line 25.

Figure 8:
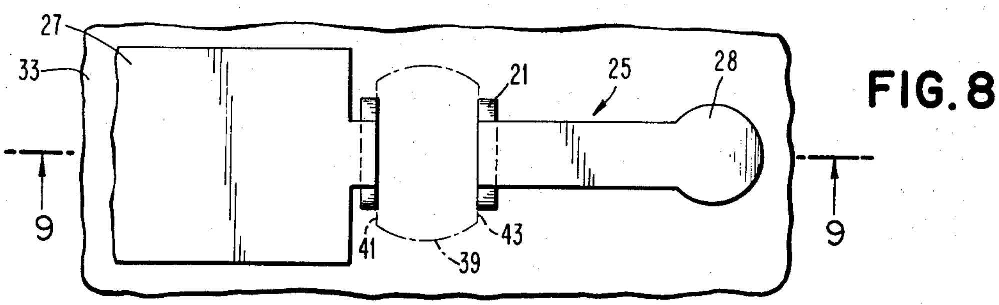
FIG. 8 is a plan view of the substrate of FIG. 5 with a portion of the conductor line deleted.
Figure 9:
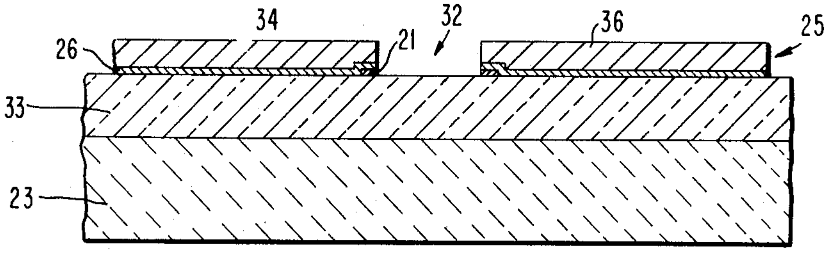
FIG. 9 is a cross sectional view along the lines 9—9.

In order to customize the circuit pattern, a mechanical force is applied to certain of the delete areas formed by pads 21. As illustrated in FIGS. 8 and 9 applying a force to the portion of conductor line 25 overlying pad 21 produces a clean break 32 between portions 34 and 36 of line 25 without any damage to glass layer 33. This assures the maintenance of the protection provided by thin glass layer 33 which is only about 2 mils in thickness against ion migration or moisture penetration into the module which would occur and could cause failure of the entire device should the glass layer be broken or cracked.

Figure 7:
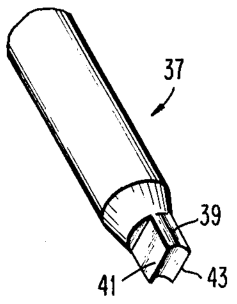
FIG. 7 is an isometric view of a portion of a device suitable for deleting portions of the conductor lines.

The deletion can be accomplished by a variety of methods such as a chisel, or ultrasonic probe, etc. As shown in FIG. 7, a delete tool 37 has a cutting tip 39 which is spring loaded. The cutting tip has an arcuate cross section at the lower end providing two cutting edges 41 and 43 which are about 0.010 inches apart. The tool is adjusted to deliver approximately a 12-ounce force at a 0.030-inch deflection of the cutting tip which is placed at about 0.003 inch above the surface of the substrate. The position of the cutting tip 39 is shown in phantom in FIG. 8.

Where a number of deletions are required, for speed and accuracy the module can be mounted on an X-Y table and the areas to be deleted are successively brought under the cutting tool 37. A magnitized probe is conveniently employed to remove the deleted metal chips from the surface of the substrate.

The foregoing invention has described a structure and method of forming customized printed circuits by providing areas which are easily deleted from the substrate without damage thereto. At the same time the strength of the remaining conductor lines and deletion areas is sufficient to maintain electrical integrity during the operation of the device. The invention is particularly advantageous when employing relatively large modules having a considerable number of chips wherein the possibilities of a variety of circuits occur and where the cost of providing a customized set of depositing or etching masks would be prohibitive.

Although the invention has been particularly shown and described with reference to a preferred embodiment thereof, it will be understood by those skilled in the art that the foregoing and other changes in form and details may be made therein without departing from the spirit and scope of the invention.

We claim:

1. A method of making a conductor pattern on a module from a master pattern comprising the steps of:

a. forming a discontinuous metal film having low adhesion to the substrate surface so that said film is frangible from the substrate surface without damage to said surface, b. forming a master pattern of normally highly adherent metal conductor lines on said substrate, such that said lines are not normally frangible from the substrate surface without damage to said surface, with portions of the pattern overlying said discontinuous metal film, and c. mechanically deleting certain of said portions of the master pattern and the underlying metal film so as to electrically isolate segments of the master pattern and form different circuits.

2. A master conductive pattern for an integrated circuit module which can be customized to a variety of selected circuit patterns comprising a metal film on the surface of said module, which film is normally highly adherent such that it is not normally frangible from the module surface without damage to said surface, and a discontinuous pattern of pads of a second metal film underlying portions of the highly adherent metal film, said second metal film having low adhesion to said module such that said second metal film is frangible from the module surface without damage to the module surface, the portions of the master pattern and underlying pads being mechanically deletable without damage to the module surface to permit the electrical isolation of segments of the master pattern and the formation of different electrical circuits.

3. The conductive pattern of claim 2 wherein said discontinuous pattern of pads is copper.

4. The conductive pattern of claim 2 wherein said discontinuous pattern of pads is a metal selected from the group consisting of copper and gold and said conductive pattern comprises chromium-copper.

5. An integrated circuit module having a ceramic substrate and a thin overlying layer of glass upon which is formed a master conductor line pattern which is not normally frangible from said glass layer without damage to said glass layer with selected portions of said line pattern overlying metal pads having low adhesion to said glass layer such that they are frangible from said glass layer without damaging said glass layer, the width of said pads being at least coextensive with the overlying conductor line, such that certain of said portions of the line pattern and the underlying pads can be mechanically deleted from the module to electrically isolate segments of the master line pattern and form different circuits without damage to said glass layer.

6. The product of claim 5 wherein said low adherent metal portions are copper.

7. The product of claim 5 wherein said pads are a metal selected from a group consisting of copper and gold and said conductor line pattern comprises chromium-copper.

* * * * *